United States Patent
Jiang et al.

(10) Patent No.: US 7,713,589 B2
(45) Date of Patent: May 11, 2010

(54) METHOD FOR MAKING CARBON NANOTUBE ARRAY

(75) Inventors: Kai-Li Jiang, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 413 days.

(21) Appl. No.: 11/371,993

(22) Filed: Mar. 8, 2006

(65) Prior Publication Data

US 2006/0263524 A1 Nov. 23, 2006

(30) Foreign Application Priority Data

Mar. 31, 2005 (CN) .................. 2005 1 0033948

(51) Int. Cl.
*C23C 16/00* (2006.01)
(52) U.S. Cl. .................. 427/428.1; 423/447.1
(58) Field of Classification Search ......... 423/447.1
See application file for complete search history.

(56) References Cited

U.S. PATENT DOCUMENTS

| | | | |
|---|---|---|---|
| 5,374,415 A | 12/1994 | Alig et al. | |
| 6,177,292 B1 | 1/2001 | Hong et al. | |
| 6,232,706 B1 | 5/2001 | Dai et al. | |
| 6,315,977 B1 | 11/2001 | Cantacuzene | |
| 6,350,488 B1 * | 2/2002 | Lee et al. .................. | 427/249.1 |
| 6,569,765 B1 | 5/2003 | Solomon et al. | |
| 6,627,552 B1 | 9/2003 | Nishio et al. | |
| 6,656,285 B1 | 12/2003 | Melnik et al. | |
| 6,706,119 B2 | 3/2004 | Tsvetkov et al. | |
| 6,768,135 B2 | 7/2004 | Solomon et al. | |
| 6,936,357 B2 | 8/2005 | Melnik et al. | |
| 7,214,360 B2 * | 5/2007 | Chen et al. ............... | 423/447.3 |
| 7,276,121 B1 | 10/2007 | Bliss et al. | |

(Continued)

FOREIGN PATENT DOCUMENTS

CN 1266018 9/2000

(Continued)

OTHER PUBLICATIONS

Moshkalyov et al., Carbon nanotubes growth by chemical vapor deposition using thin film nickel catalyst, Sep. 25, 2004, Materials Science and Engineering B, vol. 112, Issues 2-3, pp. 147-153.*

(Continued)

*Primary Examiner*—Michael Kornakov
*Assistant Examiner*—Xiao Zhao
(74) *Attorney, Agent, or Firm*—Jeffrey T. Knapp

(57) ABSTRACT

A method for making an array of carbon nanotubes includes the steps of: (a) providing a substrate with a film of catalyst provided thereon; (b) disposing the substrate in a reaction chamber; (c) introducing a carrier gas into the reaction chamber and heating the reaction chamber to a predetermined temperature; (d) introducing a carbon source gas and a hydrogen gas into the reaction chamber separately and simultaneously; the hydrogen gas being introduced such that the hydrogen gas has less of a distance to travel in the reaction chamber than does the carbon source gas to reach the substrate; and (e) growing the array of the carbon nanotubes from the substrate.

20 Claims, 2 Drawing Sheets

U.S. PATENT DOCUMENTS

| | | |
|---|---|---|
| 7,279,047 B2 | 10/2007 | Melnik et al. |
| 7,288,321 B2 | 10/2007 | Liu et al. |
| 2002/0132495 A1 | 9/2002 | Siegel et al. |
| 2002/0172767 A1 | 11/2002 | Grigorian et al. |
| 2003/0039750 A1 | 2/2003 | Mao et al. |
| 2004/0053053 A1 | 3/2004 | Jiang |
| 2004/0105807 A1 | 6/2004 | Fan et al. |
| 2004/0136896 A1 | 7/2004 | Liu et al. |
| 2004/0253167 A1* | 12/2004 | Silva et al. ............... 423/447.1 |
| 2005/0046322 A1 | 3/2005 | Kim et al. |
| 2005/0089467 A1* | 4/2005 | Grill et al. ............... 423/447.3 |
| 2005/0112051 A1 | 5/2005 | Liu et al. |
| 2005/0271829 A1 | 12/2005 | Kumar et al. |
| 2006/0269669 A1 | 11/2006 | Jiang et al. |

FOREIGN PATENT DOCUMENTS

| | | |
|---|---|---|
| JP | 2001-20071 | 1/2001 |

OTHER PUBLICATIONS

Li, W Z et. al., Large-scale synthesis of aligned carbon nanotubes, Science, 274, 1701-1703, Dec. 1996.

Cassell et al., Large scale CVD synthesis of Single Walled Carbon Nanotubes, Jun. 1, 1999, J. Phys. Chem. B 103, 6484-6492.

* cited by examiner

METHOD FOR MAKING CARBON NANOTUBE ARRAY

RELATED APPLICATIONS

This application is related to commonly-assigned copending applications entitled, "DEVICE AND METHOD FOR MAKING CARBON NANOTUBE ARRAY", Ser. No. 11/371,997, filed Mar. 8, 2006, "DEVICE FOR MAKING CARBON NANOTUBE ARRAY", Ser. No. 11/371,992, filed Mar. 8, 2006, and "METHOD FOR MAKING CARBON NANOTUBE ARRAY", Ser. No. 11/371,989 filed Mar. 8, 2006. Disclosures of the above identified applications are incorporated herein by reference.

BACKGROUND

1. Technical Field

The invention relates generally to methods for making carbon nanotubes, and more particularly to a method for making an array of carbon nanotubes.

2. Discussion of Related Art

Carbon nanotubes were discovered by S. Iijima in 1991, they are very small tube-shaped structures, each essentially having composition similar to that of a graphite sheet rolled into a tube. Theoretical studies show that carbon nanotubes exhibit either metallic or semiconductive behavior depending on the radii and helicity of the tubules. Carbon nanotubes have interesting and potentially useful electrical and mechanical properties, and have many potential uses in electronic devices. Carbon nanotubes also feature extremely high electrical conductivity, very small diameters (much less than 100 nanometers), large aspect ratios (i.e. length/diameter ratios) (greater than 1000), and a tip-surface area near the theoretical limit (the smaller the tip-surface area, the more concentrated the electric field, and the greater the field enhancement factor). These features make carbon nanotubes ideal candidates for electron field emitters, white light sources, lithium secondary batteries, hydrogen storage cells, transistors, and cathode ray tubes (CRTs).

Generally, there are three methods for manufacturing carbon nanotubes. The first method is the arc discharge method, which was first discovered and reported in an article by Sumio Iijima entitled "Helical Microtubules of Graphitic Carbon" (Nature, Vol. 354, Nov. 7, 1991, pp. 56-58). The second method is the laser ablation method, which was reported in an article by T. W. Ebbesen et al. entitled "Large-scale Synthesis of Carbon Nanotubes" (Nature, Vol. 358, 1992, pp. 220). The third method is the chemical vapor deposition (CVD) method, which was reported in an article by W. Z. Li entitled "Large-scale Synthesis of Aligned Carbon Nanotubes" (Science, Vol. 274, 1996, pp. 1701).

In the arc discharge method, a carbon vapour is created by an arc discharge between two carbon electrodes with or without catalyst. Carbon nanotubes self-assemble from the resulting carbon vapour. In the laser ablation technique, high-powered laser pulses impinge on a volume of carbon-containing feedstock gas (methane or carbon monoxide). Carbon nanotubes are thus condensed by the laser ablation and are deposited on an outside collector. However, the carbon nanotubes produced by the arc discharge and the laser ablation vary greatly in diameter and length, with little control over the dimensions of the resulting product. Moreover, poor carbon nanotube yield and prohibitive cost involved in making the device mean that the two methods difficult to scale up to suit industrial production.

In the chemical vapour deposition (CVD) method, carbon filaments and fibers are produced by thermal decomposition of a hydrocarbon gas on a transition metal catalyst in a chemical vapour deposition reaction chamber. In general, the chemical vapour deposition process results in both multi-walled nanotubes (MWNTs) and single-walled nanotubes (SWNTs) being produced. Compared with the arc discharge method and laser ablation method, the chemical vapour deposition method is a more a simple process and can easily be scaled up for industrial production. However, the carbon nanotubes manufactured by the chemical vapour deposition process aren't bundled to form an array, thus the CVD process can't assure both quantity and quality of production.

In view of the above, another method, such as a thermal chemical vapor deposition method is disclosed where an array of carbon nanotubes are formed vertically aligned on a large-size substrate. The thermal CVD method includes the steps of forming a metal catalyst layer on a substrate; etching the metal catalyst layer to form isolated nano-sized catalytic metal particles; growing carbon nanotubes from said isolated nano-sized catalytic metal particles by the thermal chemical vapor deposition (CVD) process; and purifying the carbon nanotubes in-situ.

The carbon nanotubes formed by the above-described method are vertically aligned on the substrate. However, the above-described method is a rather complicated process. Furthermore, excess amorphous carbon lumps and metal catalyst lumps are also produced along with the carbon nanotubes and adhered to inner or outer sidewalls of the carbon nanotubes. Thus, the above-described method needs complicated purification processes. Moreover, the above-described method is performed at a temperature in the range from 700° C. to 1000° C., thus it is difficult to mass synthesize the carbon nanotubes due to the high synthesis temperature. Furthermore, the carbon nanotubes formed in the above-described method are generally comprised of MWNTs and SWNTs. These mixed carbon nanotubes do not sufficiently exhibit the useful properties of a single-type array of carbon nanotubes.

What is needed, therefore, is a method for making a carbon nanotube array that is easy to operate, uses a simple process, and can form high purity carbon nanotube arrays.

SUMMARY

A method for making an array of carbon nanotubes includes the steps of (a) providing a substrate with a film of catalyst provided thereon; (b) disposing the substrate in a reaction chamber; (c) introducing a carrier gas into the reaction chamber and heating the reaction chamber to a predetermined temperature; (d) introducing a carbon source gas and a hydrogen gas into the reaction chamber, the hydrogen gas being introduced in a manner so that the majority of the introduced hydrogen gas that reaches the substrate does not react with the carbon source gas; and (e) growing the array of the carbon nanotubes from the substrate.

At least 65 percent of the introduced hydrogen gas that reaches the substrate does not react with the carbon source gas. The carrier gas comprises at least one of a noble gases or nitrogen gas, the carbon source gas is selected from the group consisting of ethylene, methane, acetylene, ethane and any combination thereof, the catalyst is selected from the group consisting of iron, cobalt, nickel and any combination alloy thereof, and the carbon nanotube array formed thereof is an array of multi-walled carbon nanotubes.

The carrier gas is introduced at a flow rate in the range from 100 to 1000 sccm, the carbon source gas is introduced at a flow rate in the range from 5 to 30 sccm, the hydrogen is introduced at a flow rate in the range from 100 to 500 sccm.

The predetermined temperature is in the range of 600 to 720° C.

In step (e), the carbon source gas is introduced into the reaction chamber for 30 to 60 minutes, and the array of the carbon nanotubes with a height of about 100 microns extends from the substrate in a direction substantially perpendicular to the substrate.

Pressure in the reaction chamber is maintained at about one atmospheric pressure.

Compared with conventional CVD devices for making carbon nanotube arrays, the devices in the described embodiments for making carbon nanotube arrays has the following advantages. Firstly, the present method can be performed at a relatively low temperature, for example, in the range from 600 to 700° C. In the preferred embodiment of the method, an array of bundled and super-aligned carbon nanotubes can be synthesized at temperatures in the range from 620 to 690° C. Secondly, growth speed and yield of carbon nanotubes are both improved. After growing carbon nanotubes for 30 to 60 minutes, the carbon nanotube array has a height of a few hundred micrometers to a few millimeters. Thirdly, the present device and method for growing carbon nanotubes is inexpensive. The carrier and carbon source gases in the preferred method can be inexpensive argon and acetylene. The catalyst can be inexpensive iron.

Other advantages and novel features of the present method for making a carbon nanotube array will become more apparent from the following detailed description of preferred embodiments, when taken in conjunction with the accompanying drawings.

BRIEF DESCRIPTION OF THE DRAWINGS

Many aspects of the present method can be better understood with reference to the following drawings. The components in the drawings are not necessarily to scale, the emphasis instead being placed upon clearly illustrating the principles of the present method for making a carbon nanotube array.

Figure 1:
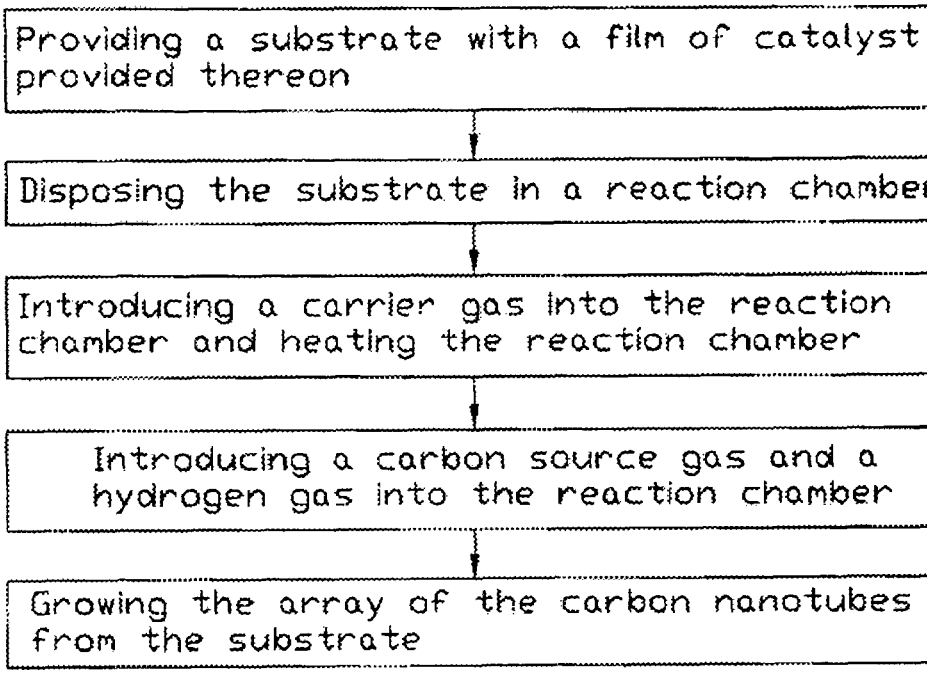
FIG. 1 is a flow chart of a method for making an array of carbon nanotubes in accordance with a preferred embodiment of the present invention.

Corresponding reference characters indicate corresponding parts throughout the several views. The exemplifications set out herein illustrate at least one preferred embodiment of the present method for making a carbon nanotube array in one form, and such exemplifications are not to be construed as limiting the scope of the invention in any manner.

DETAILED DESCRIPTION OF PREFERRED EMBODIMENTS

Reference will now be made to the drawings to describe embodiments of the present method for making an array of carbon nanotubes in detail.

Figure 2:
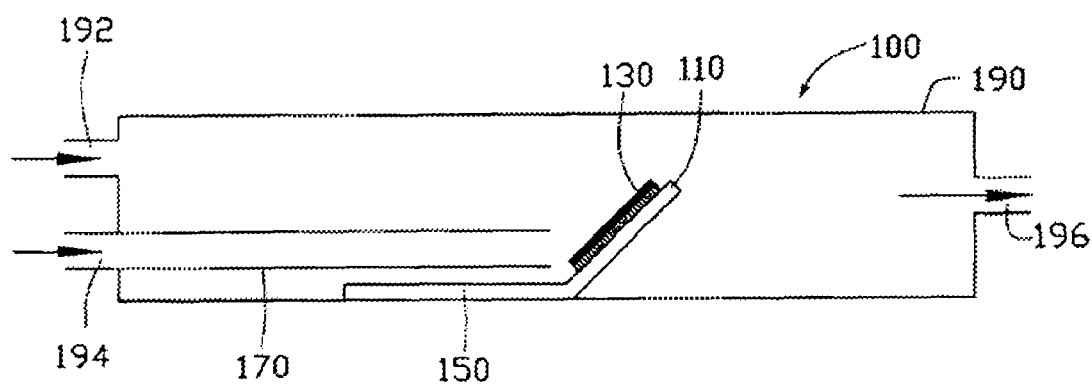
FIG. 2 is a schematic view of a device for performing the method.

Referring to FIGS. 1 and 2, one embodiment of the present method for making a carbon nanotube array is provided. The embodiment includes the following steps. Firstly, a substrate 110 is provided, and a film of catalyst 130 is formed on the substrate 110. The substrate 110 can be made of silicon, glass or quartz. In the preferred embodiment the substrate 110 is made of silicon. The film of catalyst 130 is uniformly disposed on the substrate 110 by means of chemical vapor deposition, thermal deposition, electron-beam deposition, or sputtering. The catalyst 110 can be made of iron (Fe), cobalt (Co), nickel (Ni), or any alloy thereof. In the preferred embodiment, the catalyst 110 is made of iron.

Secondly, a quartz boat 150 is provided. The quartz boat 150 includes a horizontal portion and an oblique portion. The oblique portion is configured to be inclined at an oblique angle relative to the horizontal portion. The substrate 110 is disposed on the oblique portion of the quartz boat 150. Therefore, the substrate 10 is obliquely oriented relative to the horizontal direction.

Thirdly, a horizontal reaction chamber 190 with a first gas inlet 192, a second gas inlet 194 and a gas outlet 196 is provided. The first gas inlet 192 and the second gas inlet 194 are located at one end of the reaction chamber 190. The gas outlet 196 is located at the other opposite end of the reaction chamber 190. A gas introducing device 170 with two open ends is disposed in the reaction chamber 190. The outer open end of the gas introducing device 170 is connected to the second gas inlet 194, and the inner open end of the gas introducing device 170 extends into the reaction chamber 190. The quartz boat 150 with the substrate 110 is disposed on a bottom of the reaction chamber 190. The substrate 110 with the catalyst 130 is disposed as close as possible to the gas introducing device 170, facing the inner open end of the introducing device 170 so that more amount, for example, at least the majority of the introduced hydrogen gas that reaches the substrate does not react with the carbon source gas.

Fourthly, a carrier gas is continuously introduced into the reaction chamber 19 from the first gas inlet 192 at one atmosphere of pressure. The carrier gas is used to create an atmosphere of inert gas in the reaction chamber 19. Then, the reaction chamber 18 is heated gradually to a predetermined temperature depending on various situations. A carbon source gas which mixes with the carrier gas is introduced into the reaction chamber 190 from the first gas inlet 192, and simultaneously, hydrogen gas is introduced into the reaction chamber 190 from the second gas inlet 194 so that at least the majority of the introduced hydrogen gas that reaches the substrate does not react with the carbon source gas. The carrier gas can be a nitrogen ($N_2$) gas or a noble gas. The carbon source gas can be ethylene ($C_2H_4$), methane ($CH_4$), acetylene ($C_2H_2$), ethane ($C_2H_6$) or any combination thereof In the preferred embodiment, the carrier gas is argon (Ar), the carbon source gas is acetylene, and at least 65 percent or more of the introduced hydrogen gas that reaches the substrate does not react with the carbon source gas. The argon flow-rate is in the range from 100 to 1000 sccm (Standard Cubic Centimeter per Minute), the acetylene flow-rate is in the range from 5 to 30 sccm, and a flow rate of hydrogen is in the range form 100 to 500 sccm. In the preferred embodiment, the flow rate of the argon is 300 sccm, and the flow rate of the hydrogen is 100 sccm. The predetermined temperature of the method can be in the range from 600 to 720° C. In the preferred embodiment, the predetermined temperature is in the range from 620 to 690° C.

Due to catalysising by the catalyst 130, the carbon source gas supplied into the reaction chamber 190 is pyrolized in a gas phase into carbon units (C═C or C) and free hydrogen ($H_2$). The carbon units are absorbed on a free surface of the catalyst 130 and diffused into the catalyst 130. When the catalyst 130 is supersaturated with the dissolved carbon units, carbon nanotube growth is initiated. As the intrusion of the carbon units into the catalyst 130 continue, an array of carbon nanotubes is formed. The carbon nanotube array formed by the preferred embodiment is a multi-walled carbon nanotube array. Density, diameter and length of the multi-walled carbon nanotube array can be controlled by adjusting the flow rates of the carbon source gas and the carrier gas, and by altering the predetermined temperature and the reaction time. In addition, the hydrogen introduced by the second gas inlet can flow to the substrate, and act on the catalyst directly. That is, the hydrogen can avoid reaction with the carbon source gas, and the catalyst can be activated directly by the hydrogen. In this way, the growth speed of the carbon nanotubes is increased and the height of the carbon nanotube array is enhanced. In the preferred first embodiment, the reaction time is in the range from 30 to 60 minutes. The synthesis method can produce carbon nanotubes with a length greater than 3-400 micrometers, and have a diameter in the range from 10 to 30 nanometers.

Figure 3:
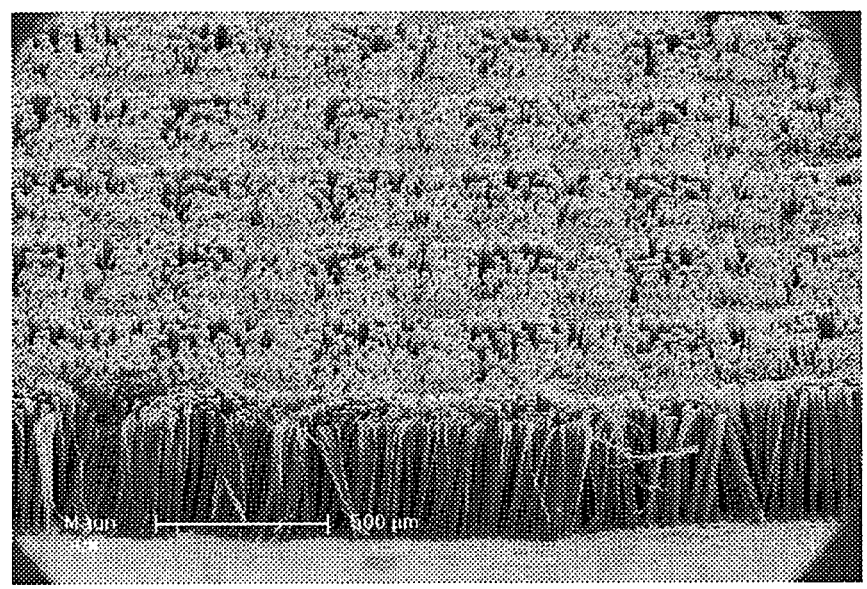
FIG. 3 shows a Scanning Electron Microscope (SEM) image of the array of the carbon nanotubes.
Figure 4:
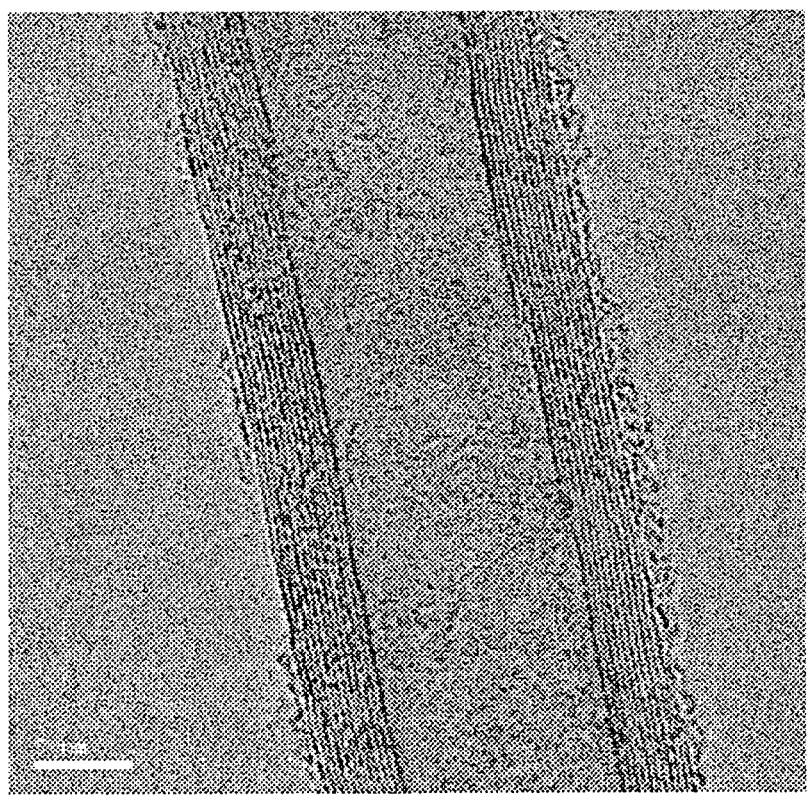
FIG. 4 shows a Transmission Electron Microscope (TEM) image of the array of the carbon nanotubes.

Referring to FIGS. 3 and 4, a SEM image and a TEM image of the multi-walled carbon nanotube array formed by the present method are shown. It can be seen that the carbon nanotubes in the carbon nanotube array are highly bundled and super-aligned. The height of the carbon nanotube array is about 300 micrometers.

It is noted that, the reaction chamber of the device adopted in the present method includes devices for use in chemical vapor deposition, such as horizontal CVD devices, vertical CVD devices and a CVD device with a removable quartz boat. Moreover, the reaction chamber of the device adopted in the present method isn't limited to two gas inlets. It is understood that a free reaction chamber with a gas inlet connected with a gas introducing device for introducing hydrogen to catalyst directly would correspond to the device adopted in the present method. Furthermore, the device adopted in the present method can synthesize large amounts of carbon nanotube arrays by disposing a plurality of substrate in the reaction chamber with a plurality of gas introducing devices. The gas introducing devices are corresponding to the substrate respectively. The property of carbon nanotubes is essentially uniform. Thus, both quality and production of the carbon nanotubes can be controlled by the device adopted in the present method. Furthermore, the film of catalyst of the device adopted in the present method can be patterned for growing patterned carbon nanotube array. Based on the device adopted in the present method, the future application of carbon nanotubes in field emission device or other electron device can be realized gradually.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

We claim:

1. A method for making an array of carbon nanotubes, comprising the steps of:
   (a) providing a substrate with a film of catalyst provided thereon;
   (b) disposing the substrate in a reaction chamber;
   (c) supplying a carrier gas into the reaction chamber and heating the reaction chamber to a predetermined temperature; and
   (d) introducing a carbon source gas and a hydrogen gas into the reaction chamber separately and simultaneously; the hydrogen gas being introduced such that the hydrogen gas has less of a distance to travel in the reaction chamber than does the carbon source gas to reach the substrate.

2. The method as claimed in claim 1, wherein the majority of the introduced hydrogen gas that reaches the substrate does not react with the carbon source gas and activates the film of catalyst.

3. The method as claimed in claim 1, wherein at least 65 percent of the introduced hydrogen gas that reaches the substrate does not react with the carbon source gas.

4. The method as claimed in claim 1, wherein the carrier gas comprises at least one of a noble gas or a nitrogen gas.

5. The method as claimed in claim 1, wherein the carbon source gas is selected from the group consisting of ethylene, methane, acetylene, ethane, and any combination thereof.

6. The method as claimed in claim 5, wherein the carrier gas comprises an argon gas.

7. The method as claimed in claim 6, wherein the carbon source gas is comprised of acetylene, and the array of the carbon nanotubes formed thereby is an array of multi-walled carbon nanotubes.

8. The method as claimed in claim 1, wherein the catalyst is selected from the group consisting of iron, cobalt, nickel and any combination alloy thereof.

9. The method as claimed in claim 8, wherein the carrier gas is introduced at a flow rate in the range from 100 sccm to 1000 sccm.

10. The method as claimed in claim 9, wherein the carrier gas is introduced at a flow rate of about 300 sccm.

11. The method as claimed in claim 1, wherein the carbon source gas is introduced at a flow rate in the range from 5 sccm to 30 sccm.

12. The method as claimed in claim 11, wherein the carbon source gas is introduced into the reaction chamber for 30 minutes to 60 minutes, and the array of the carbon nanotubes with a height of about 100 microns extends from the substrate in a direction substantially perpendicular to the substrate.

13. The method as claimed in claim 1, wherein the hydrogen gas is introduced at a flow rate in the range from 100 sccm to 500 sccm.

14. The method as claimed in claim 13, wherein the hydrogen gas is introduced at a flow rate of about 100 sccm.

15. The method as claimed in claim 1, wherein the predetermined temperature is in the range of 600° C. to 720° C.

16. The method as claimed in claim 1, wherein a pressure in the reaction chamber is maintained at about one atmospheric pressure.

17. The method as claimed in claim 1, wherein a wall of the reaction chamber defines a first gas inlet and a second gas inlet the carbon source gas is introduced into the reaction chamber from the first gas inlet and the hydrogen gas is introduced into the reaction chamber from the second gas inlet.

18. The method as claimed in claim 17, wherein a gas introducing device with two open ends is disposed in the reaction chamber, an outer open end of the gas introducing device is connected to the second gas inlet, and an inner open end of the gas introducing device extends into the reaction chamber, the hydrogen gas travels through the gas introducing device.

19. The method as claimed in claim 18, wherein the substrate with the catalyst is disposed adjacent to the inner open end of the gas introducing device.

20. The method as claimed in claim 19, wherein the catalyst on the substrate faces the inner open end of the gas introducing device.

* * * * *